United States Patent [19]
Degani et al.

[11] Patent Number: 6,043,670
[45] Date of Patent: Mar. 28, 2000

[54] METHOD FOR TESTING INTEGRATED CIRCUITS

[75] Inventors: Yinon Degani, Highland Park; Alan Michael Lyons, New Providence, both of N.J.

[73] Assignee: Lucent Technologies Inc., Murray Hill, N.J.

[21] Appl. No.: 08/991,867

[22] Filed: Dec. 16, 1997

[51] Int. Cl.[7] .................................................. G01R 31/02
[52] U.S. Cl. ............................................................ 324/765
[58] Field of Search ..................................... 324/765, 755, 324/754, 158.1; 438/15, 107, 114

[56] References Cited

U.S. PATENT DOCUMENTS

| | | | |
|---|---|---|---|
| 5,140,405 | 8/1992 | King et al. .............................. | 257/727 |
| 5,290,710 | 3/1994 | Hai-Ali-Ahmadi et al. ............ | 438/15 |
| 5,406,210 | 4/1995 | Pedder .................................... | 324/757 |
| 5,440,240 | 8/1995 | Wood et al. ............................ | 324/765 |
| 5,479,694 | 1/1996 | Baldwin ................................. | 324/754 |
| 5,691,041 | 11/1997 | Frankeny et al. ...................... | 428/209 |
| 5,851,845 | 12/1998 | Wood et al. ............................ | 438/15 |

*Primary Examiner*—Josie Ballato
*Assistant Examiner*—Minh Tang

[57] ABSTRACT

The specification describes a technique for testing packaged or unpackaged IC devices in which the devices are aligned and placed onto a tacky layer of an anisotropic conductive medium (ACM). The tacky ACM layer provides the necessary electrical contact to the IC device while under test, and also preserves the alignment of the IC device during movement between stations. When electrical testing of the IC device is completed the IC device packages are lifted free of the tacky layer and permanently bonded to an interconnection substrate. In one embodiment the test interconnection substrate is a replica of the permanent interconnection substrate. In another mode of practicing the invention the test interconnection substrate is the actual permanent interconnection substrate, and the IC device is bonded in situ after electrical testing.

21 Claims, 2 Drawing Sheets

METHOD FOR TESTING INTEGRATED CIRCUITS

FIELD OF THE INVENTION

This invention relates to test methods for semiconductor integrated circuits, and more specifically to handling techniques for efficient transfer of unpackaged and packaged integrated circuit chips through the test facility.

BACKGROUND OF THE INVENTION

Testing of semiconductor devices at the singulated device level, i.e. prior to permanent mounting on an interconnection substrate, is typically conducted with apparatus constructed on the "bed of nails" principle. The devices under test are usually ball grid array or solder bumped ICs with perimeter arrays or area arrays of contacts on one side of the device. The array of contacts is used, after successful test, to flip-chip bond the device to an interconnection substrate.

The test apparatus typically has a large x-y array of contact pins that are brought into contact with the ICs of the device. The pins in the x-y array that align with the pads or bumps on the device are addressed with appropriate electrical circuitry in the test apparatus to apply test voltages to the device contacts and measure the electrical characteristics of the device. Some testers are universal in the sense that pins in the x-y test array will contact any given contact patterns so that different devices with different contact patterns can be tested by modifying the software used to address the array of test pins. Testers can also be made with a permanent custom pin array tailored to a particular chip design. In either case, alignment of the device under test to the array of pins is very critical.

The typical sequence in a manufacture and test facility is to sort the devices as they reach the test facility into a suitable carrier, and convey the carrier to a pick and place tool where the individual devices are placed in a test contactor. The placement performs a critical alignment at this stage between the array of contacts on the device and the contactor. Mechanically the contactor is part of the handling equipment in the manufacturing line, but is also part of the test apparatus. The contactor must handle each device delicately, without damage, and also preserve the critical alignment from the pick and place tool to the test pin array. A separate test contactor must be provided for each device I/O configuration.

In the conventional test procedure the IC device cannot be tested in its final electrical environment. This means that all chip functions cannot be tested, and the IC device is typically not tested at its ultimate speed.

STATEMENT OF THE INVENTION

We have developed a test technique for singulated IC devices or packaged IC devices that greatly simplifies the test procedure, especially the handling techniques, and eliminates the test contactor and the x-y test pin array. Moreover, it improves the reliability of the test procedure by testing the devices on an interconnection substrate which simulates a board level test. In one embodiment it can be used to test the IC devices and the interconnect substrates simultaneously, prior to mounting the device on the substrate.

These advantages are achieved according to the invention by using an interconnection substrate in place of the contactor, and testing the device on the interconnection substrate. An important feature of this test technique is mounting the IC package on the test interconnection substrate temporarily, using an anisotropic conductive medium (ACM). The ACM serves as a temporary adhesive to hold the IC device in proper alignment during the testing operation. Devices are easily dismounted after test for either permanent assembly or repair. As an alternative to testing IC devices on a test interconnection substrate, IC devices can be tested on a production interconnection substrate that becomes part of the final packaged assembly.

DETAILED DESCRIPTION

Figure 1:
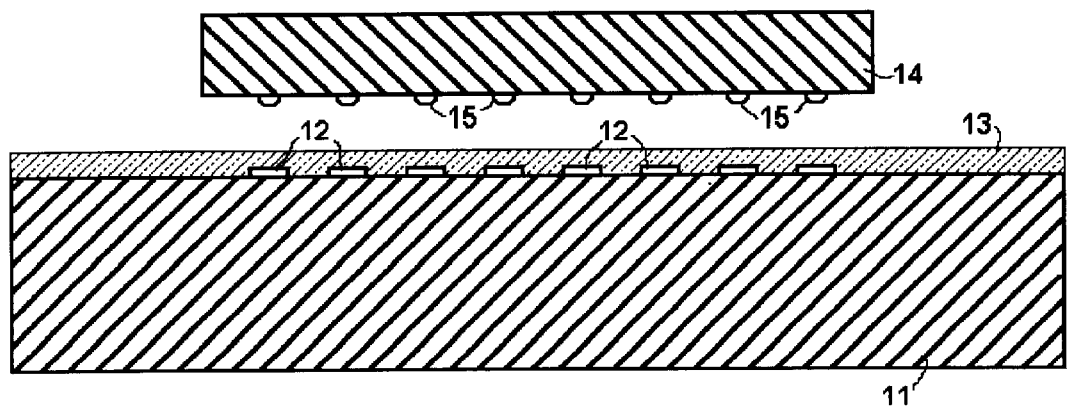
FIG. 1 is a schematic view of a device under test and a test interconnection substrate prior to mounting the device.

Referring to FIG. 1 a test interconnection substrate is shown at 11 with contact pads 12 interconnected by a printed circuit on the surface of test interconnection substrate 11. The test interconnection substrate may be a standard epoxy board, a ceramic substrate, or a silicon interconnection substrate. The substrate may be single or multilevel, and the circuit is formed by conventional means. The surface of the test interconnection substrate is covered with layer 13 of anisotropic conductive medium (ACM). Shown above the test interconnection substrate is an IC device 14 to be tested. The device 14 has an array of contacts 15 which may be gold or solder bumps or balls, or other electrical contacts for the IC device 14. The IC device may be a bumped bare IC chip, or a bumped package containing one or more IC chips.

Typical pitch of contact pads for a bumped IC chip in current technology is of the order of 50–200 $\mu$m and the spacing between pads may be 20–50 $\mu$m. The bumps are typically 15–100 $\mu$m in height (z-direction). The device package is usually square or rectangular with sides typically in the 2–50 mm range.

Figure 2:
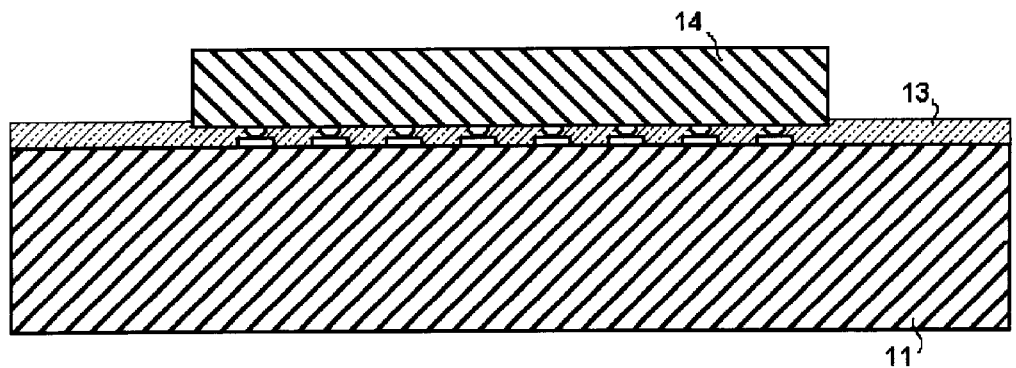
FIG. 2 is a view similar to that of FIG. 1 showing the test device temporarily mounted on the test interconnection substrate.

The IC device to be tested is shown mounted in place on the test interconnection substrate in FIG. 2. The placing of the IC device on the interconnection substrate is accomplished with a pick and place alignment tool, and the alignment between the array of contacts 15 on the IC device and the array of contacts 12 on the test interconnection substrate is critical. Once placed in proper alignment, the IC device is held in place for testing by the ACM layer 13.

Alignment of the IC device to the test interconnection substrate may be achieved using the edge of the test interconnection substrate as an alignment reference, or may use fiducial marks on the test interconnection substrate. If the fiducial marks are obstructed by ACM layer 13, specially engraved (raised) fiducial marks can be used that extend through the surface of the ACM layer.

The ACM layer is formulated to provide a tacky surface that holds the IC devices in place during the testing operation. The alignment mentioned above is preserved by this tacky layer during transfer of devices between stations in the test facility.

Figure 3:
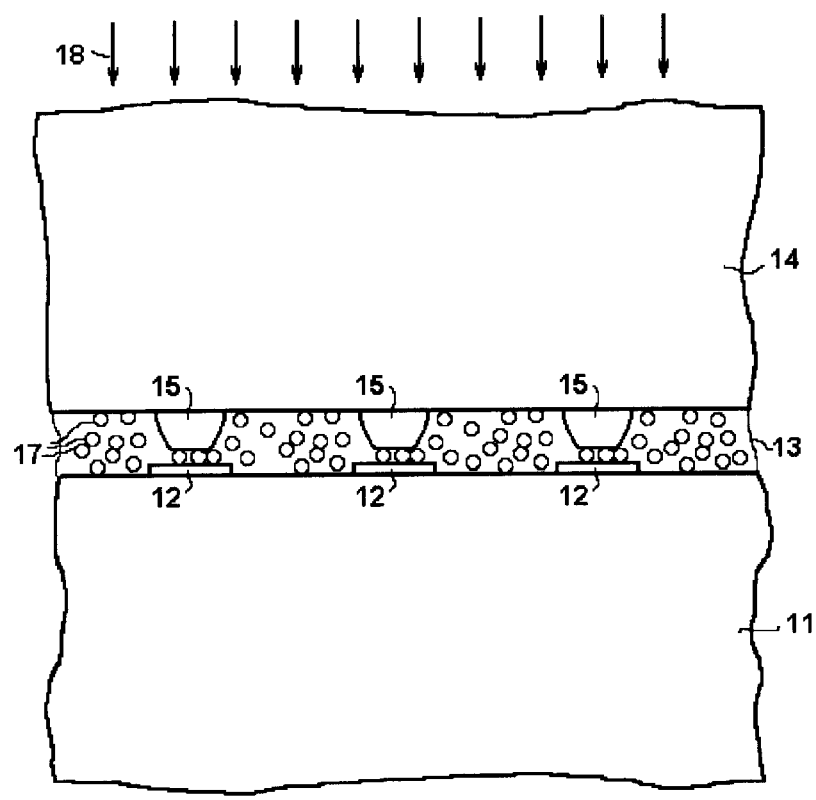
FIG. 3 is a view of a portion of FIG. 2 showing the temporary mounting arrangement in more detail.

The interface between the electrical contact arrays and the tacky layer of ACM is shown in more detail in FIG. 3, where the interconnect substrate 11, with interconnect circuitry 12, is covered with the tacky ACM layer 13. The IC device 14, with solder bump contacts 15, is shown "tacked" in place with the contact arrays 12 and 15 in alignment. The ACM layer 13 contains conductive particles, typically spheres, 17 suspended in a polymer matrix as shown. Pressure applied to the ACM layer, represented by the arrows 18, traps conductive spheres between the contact surfaces in the manner shown schematically in the figure to create a conductive path in the vertical (Z-) direction.

ACM materials, sometimes referred to as Z-conductive polymers or anisotropic conductive films (ACF), are well known in the art. ACM materials contain conductive particles, typically small polymer or glass spheres of the order of 3–10 microns in diameter that are plated with metal, e.g. silver or gold. Polymer particles are compressible and when trapped between rigid surfaces, e.g. contacts 12 and 15 in FIG. 3, they compress slightly under applied pressure and create a reliable z-direction conductive path. Glass particles, while not compressible, also form reliable z-direction conductive paths. As shown in the figure, the particles typically form a conductive monolayer in the z-direction between the contact surfaces, while in the x- and y-direction they remain spaced and therefore insulated from one another. The pressure needed for making a reliable electrical connection is of the order of 10–50 kg/cm$^2$.

The ACM host medium in which the conductive particles are suspended can be chosen from a variety of fluid substances. The preferred host medium is solder flux. If solder flux is used it is compatible with the solder reflow step used to attach the solder bumped IC device to the interconnection substrate during final assembly. Other materials, e.g. epoxies, polyethylene glycol, can be used but may require a separate cleaning step after testing and before solder reflow.

Epoxy ACM materials normally used in IC technology are designed to be cured and make permanent bonds. Therefore the requirements on the polymer are stringent. For the application involved here, it is only required that the polymer remain tacky throughout the test operation, i.e. remain as a prepolymer, either completely uncured or partially cured, during testing. Consequently, the demands on the properties of the material are not high. Other tacky materials, e.g. rubber materials such as uncured or partially cured styrene butadiene rubber, natural gums, or UV curable resins (uncured) such as epoxy acrylates may be suitable for layer 13.

The preferred ACM material is a solder flux. Suitable solder flux ACM materials can be either liquid or cream and will typically contain a conventional gum rosin as a vehicle. Liquid fluxes generally use solvents such as isopropyl alcohol, glycol, and glycerol. Cream solder fluxes may use butyl carbitol as the solvent. Cream fluxes are preferred for this invention because they are better suited as suspension mediums for conductive particles. To extend or enhance the action of the rosin flux an activator can be added. A variety of activators are available e.g., organic halogen acid adducts, halogenated organic compounds, di- or tri-alkyl amines, aryl or alkyl carboxylic acids, aryl or alkyl carboxylic acid chlorhydrates, anilene chlorhydrates, halo pyridenes, halo hydrate hydrazino salts, etc. These ingredients are mixed to form a solution and a thixotropic agent is added to maintain the conductive particles in suspension. Appropriate thixotropic agents are Thixatrol, Thixcin, and Kiucel. Other ingredients may be added for e.g. viscosity control. Suitable materials for viscosity control are Dymerex, Trimerex, Pentolyn, and Stabelite Esters. A formulation that is especially useful for the invention is:

| solvent- | Butyl Carbitol | 50 wt % |
| unactivated vehicle- | White Rosin | 34 wt % |
| activator- | organic acid | 2 wt % |
| suspension agent- | Thixcin | 4 wt % |
| viscosity control- | Dymerex | 10 wt % |

Conductive particles are added to this formulation to complete the ACM material. For example, the inclusion of 5 vol % of silver plated glass particles with an average size of 12 microns is suitable.

The ACM material can be applied by a variety of techniques. For example, the ACM can be screen printed on the contact pads of the interconnection substrate. The IC device is then aligned and placed on the bonding pad array of the interconnection substrate and retained in place by the ACM. The interconnection substrate is then moved to the test fixture where pressure is applied between the IC device and the interconnection substrate such that excess ACM is displaced leaving a layer of conductive particles to span the gap between the bumps on the IC device and the contact pads on the interconnection substrate (in a manner similar to that described in connection with FIG. 3). A full functional electrical test of the IC device is then performed. If the IC device functions properly, it can be removed from the interconnection substrate, cleaned if necessary, and soldered to a final interconnection substrate. Alternatively, the interconnection substrate used in the testing procedure can be the permanent interconnection substrate, in which case the substrate and the IC device can be removed from the test fixture and directly assembled together in a solder reflow step. Test fixtures can be envisioned which are provided with appropriate heating means to reflow the device in situ after a successful test.

The conductive particles in the ACM may become incorporated in the final solder connection if they are wettable by the solder. If the particles are not wettable by the solder they are trapped in excess flux residues and typically removed in the flux cleaning operation.

Figure 4:
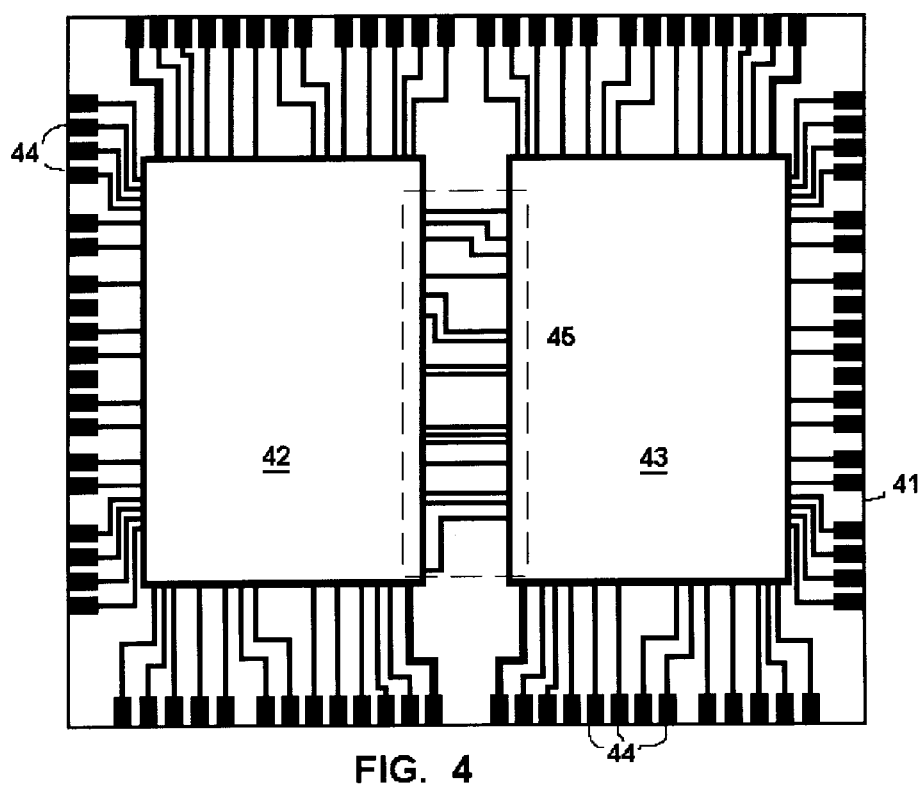
FIG. 4 is a plan view of multiple IC packages temporarily mounted for test and showing one embodiment of the test interconnection substrate.

A test interconnection substrate with devices under test mounted thereon is shown in FIG. 4. Test substrate 41 is an interconnection substrate which may be a standard epoxy printed wiring board, or may be a ceramic interconnection substrate. It may also be a silicon interconnection substrate. In the basic embodiment of the invention it is a test substrate, in another it is an actual interconnection substrate that becomes a permanent part of a finished device assembly. The test substrate shown has two devices under test 42 and 43. The solder bumps on the devices 42 and 43 are not visible but are temporarily mounted on the test substrate by the technique described above. The contact arrays on the devices under test are fanned out to substrate contacts 44, making the test contacts easier to complete and more reliable.

The ACM layer is formed over the site of the devices under test leaving the contacts 44 uncoated and easily accessible for testing. The ACM may also cover the entire test substrate surface, and test contacts made through the ACM layer as described in connection with FIG. 3.

The test circuit represented by the runners to contacts 44 may be specially designed for the test, or may be the actual layout used for the permanent interconnection substrate for the devices. More than one device is shown in FIG. 4 to illustrate the capability of the test method to test multichip modules at the "board" level. Interconnections between devices are represented by runners in area 45.

After completion of the test, the devices are simply lifted off the test substrate 44 for further assembly. Defective devices are discarded or returned for reworking. Alternatively, after the test of the devices 42 and 43 is completed, the devices can be left in place, and bonded permanently to the interconnection substrate 41. The bond may be a solder bond, effected by heating the assembly to a temperature of e.g. 180–240° C. If the ACM is an anisotropic conductive polymer the permanent bond used to affix the IC device to the interconnection substrate can be effected by curing the polymer, i.e. by heating the assembly to the polymer curing temperature, typically 120–180° C., under pressure.

As indicated earlier, device packages for which the test technique of this invention is suitable are typically unpackaged chips or chip scale packages or ball grid arrays in which the I/O contacts are perimeter or area arrays composed of gold or solder balls/bumps. The I/O contacts in these categories of devices are raised off the surface, typically by more than 2 $\mu$m, to as much as 100 $\mu$m, or even 500 $\mu$m in the case of some ball grid arrays. This feature is advantageous for the temporary ACP contacting technique to be effective. IC devices without raised contacts, i.e. bump contacts, can also be tested according to the technique of the invention. It this case it is preferred that the array of test contacts on the test interconnection substrate be raised or bumped.

The step of electrically testing the IC devices according to the invention involves the application of test voltages to selected I/O contacts through the test interconnection substrate. Thus in a typical manufacturing operation using the invention the IC devices would be conveyed from the singulation or packaging operation to a placement tool, then individually placed and aligned on the tacky surface of the test interconnection substrate. The test interconnection substrate is then inserted into the electrical tester, pressure is applied to the ACM layer, and test voltages are applied to the test interconnection substrate.

An important advantage of the test technique of the invention is that the interconnection circuit used for the test can be an identical replica of the interconnection circuit on which the IC devices are permanently mounted. As indicated above, the interconnection circuit used for the test can also be the actual interconnection substrate to which an IC device that passes the electrical test is permanently bonded. In the latter case, both the IC device and the interconnection substrate can be tested in a single operation.

In the foregoing description the ACM layer is described and shown as a layer applied to the surface of the test interconnection substrate. Alternatively it could be applied to the surface of the devices under test, or to both surfaces.

The ACM material is shown as covering the entire surface over which the IC device package is temporarily installed. Equivalent results can be obtained with the tacky ACM material applied only to the surfaces of the raised contacts. The material can be selectively applied to the contact surfaces using e.g. a rigid roller. In this case it will be evident to those skilled in the art that a standard conductive paste, i.e. an isotropic conductive medium, can be used as an alternative to an ACM material.

The adhesive force required to retain the IC device in place during the testing operation is preferably at least equivalent to the weight of the IC device or IC package. This condition can be established by placing the IC device on the tacky layer covering the interconnection substrate and inverting the substrate. If the adhesive force is sufficient the device will remained "tacked" to the substrate.

It will normally be most effective if the raised contacts on the IC device and the interconnection substrate are aligned prior to placing the IC device on the interconnection substrate. This is the normal operation of most pick and place tools. However, it is possible to place the IC device on the substrate, in contact with the ACM layer, and then align the contacts. Accordingly, these two steps when recited sequentially should be construed as including both options.

The electrical test procedure itself is conventional and comprises the steps of applying test voltages to the array of electrical test contacts, measuring the test voltages, comparing the measured test voltages to a set of predetermined IC device voltages, and selecting those IC devices with test voltages that meet said set of predetermined IC device voltages for final assembly, i.e. bonding the IC device to a permanent interconnection substrate. As will be understood by those skilled in the art the steps of measuring, comparing and selecting are carried out by automated software driven means.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for electrically testing an IC device, said device having an array of I/O contacts on at least one surface thereof, the test method comprising:

a. aligning said array of I/O contacts on the IC device with an array of electrical test contacts on a test substrate, b. placing the IC device on a layer of an anisotropic conductive medium (ACM), said layer of ACM overlying said array of electrical test contacts on said test substrate, c. applying sufficient force to create an electrical conduction path between said array of I/O contacts on the IC device and said array of electrical test contacts, d. applying test voltages to said array of electrical test contacts, e. measuring the results of said test voltages, f. comparing the measurements of step e. to a set of predetermined IC device voltages, g. selecting those IC devices with measurements that meet said set of predetermined IC device voltages, and h. permanently bonding the said array of I/O contacts on the selected IC devices to an interconnection substrate.

2. The method of claim 1 further including the step of cleaning residual ACM material from said array of I/O contacts on the IC device after removing the IC device from said layer of ACM.

3. The method of claim 1 in which the electrical test contacts are interconnected with an interconnection circuit.

4. The method of claim 3 in which the interconnection substrate has an interconnection circuit, and the interconnection circuit on the interconnection substrate is a replica of the interconnection circuit interconnecting the electrical test contacts.

5. The method of claim 1 in which the ACM layer comprises a solder flux.

6. The method of claim 1 in which the ACM layer comprises a prepolymer.

7. The method of claim 1 wherein the ACM layer provides an adhesive force between the ACM layer and the IC device which is at least equal to the weight of the IC device.

8. The method of claim 1 wherein the array of I/O contacts on said IC device are raised contacts.

9. The method of claim 1 wherein said array of electrical test contacts are raised contacts.

10. A method for electrically testing an IC device, said device having an array of I/O contacts on at least one surface thereof, the method comprising:
   a. aligning said array of I/O contacts on the IC device with an array of electrical test contacts on a test substrate,
   b. placing the IC device on a layer of an anisotropic conductive medium (ACM), said layer of ACM overlying said array of electrical test contacts on said test substrate,
   c. applying sufficient force to create an electrical conduction path between said array of I/O contacts on the IC device and said array of electrical test contacts,
   d. applying test voltages to said array of electrical test contacts,
   e. measuring the results of said test voltages,
   f. comparing the measurements of step e. to a set of predetermined IC device voltages,
   g. selecting those IC devices with measurements that meet said set of predetermined IC device voltages, and
   h. permanently bonding the said array of I/O contacts on the selected IC devices to said array of electrical test contacts.

11. The method of claim 10 in which the ACM layer comprises a solder flux and the step of permanently bonding the said array of I/O contacts on the selected IC devices to said array of electrical test contacts comprises heating said array of I/O contacts to form reflowed solder connections.

12. The method of claim 10 in which the ACM layer comprises a prepolymer and the step of permanently bonding the said array of I/O contacts on the selected IC devices to said array of electrical test contacts comprises heating said array of I/O contacts to polymerize said prepolymer.

13. The method of claim 10 wherein the ACM layer provides an adhesive force between the ACM layer and the IC device which is at least equal to the weight of the IC device.

14. The method of claim 10 wherein the array of I/O contacts on said IC device are raised contacts.

15. The method of claim 10 wherein said array of electrical test contacts are raised contacts.

16. A method for the manufacture of multichip IC devices in which at least two IC chips are mounted on an interconnection substrate, said IC chips having an array of I/O contacts on at least one surface thereof, the method comprising:
   a. aligning said array of I/O contacts on the IC devices with arrays of electrical test contacts on a test substrate,
   b. placing the IC devices on a layer of an anisotropic conductive medium (ACM), said layer of ACM overlying said arrays of electrical test contacts on said test substrate,
   c. applying sufficient force to create an electrical conduction path between said array of I/O contacts on the IC devices and said arrays of electrical test contacts on said interconnection substrate,
   d. applying test voltages to said array of electrical test contacts,
   e. measuring the results of said test voltages,
   f. comparing the measurements of step e. to a set of predetermined IC device voltages,
   g. selecting those IC devices with measurements that meet said set of predetermined IC device voltages, and
   h. permanently bonding the said array of I/O contacts on the selected IC devices to said arrays of electrical test contacts.

17. The method of claim 16 in which the said IC chips are packaged IC chips.

18. The method of claim 16 in which the said IC chips are bare IC chips.

19. The method of claim 16 wherein the array of I/O contacts on said IC device are raised contacts.

20. The method of claim 16 wherein said array of electrical test contacts are raised contacts.

21. A method for electrically testing an IC device, said device having an array of I/O contacts on at least one surface thereof, the test method comprising:
   a. aligning said array of I/O contacts on the IC device with an array of electrical test contacts on an interconnection substrate,
   b. placing the IC device on a layer of a conductive medium, said layer of conductive medium overlying at least said array of electrical test contacts on said interconnection substrate,
   c. applying test voltages to said array of electrical test contacts,
   e. measuring the results of said test voltages,
   f. comparing the measurements of step e. to a set of predetermined IC device voltages,
   g. selecting those IC devices with measurements that meet said set of predetermined IC device voltages, and
   h. permanently bonding the said selected IC devices to said interconnection substrate.

* * * * *